(12) United States Patent
Cooney, III et al.

(10) Patent No.: US 7,045,472 B2
(45) Date of Patent: May 16, 2006

(54) METHOD AND APPARATUS FOR SELECTIVELY ALTERING DIELECTRIC PROPERTIES OF LOCALIZED SEMICONDUCTOR DEVICE REGIONS

(75) Inventors: Edward C. Cooney, III, Jericho, VT (US); William T. Motsiff, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 10/709,313

(22) Filed: Apr. 28, 2004

(65) Prior Publication Data

US 2005/0245098 A1 Nov. 3, 2005

(51) Int. Cl.
*H01L 21/31* (2006.01)
*H01L 21/469* (2006.01)
*H01L 21/26* (2006.01)

(52) U.S. Cl. ..................................... 438/781
(58) Field of Classification Search ................ 438/781
See application file for complete search history.

(56) References Cited

U.S. PATENT DOCUMENTS

| | | | |
|---|---|---|---|
| 5,084,299 A | 1/1992 | Hirsch et al. | |
| 5,087,589 A | 2/1992 | Chapman et al. | |
| 5,387,114 A | 2/1995 | Brunker et al. | |
| 5,391,516 A | 2/1995 | Wojnarowski et al. | |
| 6,060,895 A | 5/2000 | Soh et al. | |
| 6,288,905 B1 | 9/2001 | Chung | |
| 6,519,753 B1 | 2/2003 | Ang et al. | |
| 6,685,983 B1 | 2/2004 | Hawker et al. | |
| 2004/0052948 A1* | 3/2004 | Gronbeck et al. | .......... 427/299 |

* cited by examiner

*Primary Examiner*—Asok Kumar Sarkar
(74) *Attorney, Agent, or Firm*—Lisa U. Jaklitsch; Cantor Colburn LLP

(57) ABSTRACT

A method for selectively altering dielectric properties of a semi-conductor device. In an exemplary embodiment, the method includes applying energy to a local region of interest, the local region of interest including a thermally alterable dielectric such that said heating caused by the applied energy causes a dielectric constant of the thermally alterable dielectric to change.

19 Claims, 3 Drawing Sheets

METHOD AND APPARATUS FOR SELECTIVELY ALTERING DIELECTRIC PROPERTIES OF LOCALIZED SEMICONDUCTOR DEVICE REGIONS

BACKGROUND OF INVENTION

The present invention relates generally to integrated circuit devices, and, more particularly, to a method and apparatus for selectively altering dielectric properties of localized regions within an integrated circuit device.

Advancements in the technology of integrated circuits have enabled designers to place relatively large numbers of digital logic gates as an array on a single integrated circuit (IC) chip. As a result, numerous approaches have evolved for interconnecting the logic gates of such high-density, digital logic ICs. A first approach (which may be thought of in terms or a "hard wired" interconnection) uses the fixed layout of various conductive paths in the IC that are either diffused in the substrate or patterned in metallization layers of the IC to interconnect input and output terminals of logic gates, one to the next. As integrated circuit devices have become able to perform more functions within a single integrated circuit chip, the manufacturers of integrated circuit chips have developed ways of automatically and quickly responding to orders for custom chips to perform specific functions for specific applications.

Typically, mask programmed gate array manufacturers apply custom metallization layers as a final step in a standard manufacturing process in order to connect transistors located within a semiconductor substrate to perform a particular logic function ordered by a customer. Manufacturers also provide fully customized integrated circuit devices in which the entire layout of the chip is selected to meet the needs of the customer. An Application Specific Integrated Circuit (ASIC) is a term used in the industry to refer to an integrated circuit device for which the design is completed before manufacturing is completed and the IC is not programmable later. For the customer with a finalized design intended for long term, large volume production, custom metallization or full custom design can be an excellent choice.

On the other hand, for customers that make frequent design changes, desire only small numbers of identical devices, or that may not yet have fully tested a new design and remain in the early stages of a product's life cycle, field programmable integrated circuit chips are an alternative choice. In one form of a field programmable chip, there are several pass transistors that can be turned on or off to connect/not connect corresponding lines to logic circuits, to other lines, or to input/output pads. By turning on a particular combination of pass transistors and connecting a particular set of lines, a user can obtain a desired function. The user can also reprogram a different design into the chip by turning on different combinations of pass transistors. In another form of programmable chip, interconnection of metal lines can be achieved through a field programmable via connection typically known as an antifuse.

The field programmable approach loses its advantage over the mask-defined approach in later phases of a product's life cycle when demand for the product grows, uncertainty about the design disappears, and chips need to be produced in relatively large volumes (e.g., 10,000 units or more). The total cost of the chip at such a point in its life cycle tends to be greater when the chip is a field programmable logic device (FPLD) rather than a mask-defined chip. One reason field programmable chips have a larger overall cost is that the memory cells and pass transistors in field programmable chips consume large amounts of space compared to the simple metal process used in mask-defined chips.

In addition, software design tools are also used to simplify the process of programming a FPLD by executing a wide variety of tasks such as analysis and minimization of circuit designs, determining if a circuit design can be implemented by a target FPLD, partitioning a circuit design into logic functions which can be implemented by a target FPLD, selecting which circuit design logic function is implemented by which FPLD logic function, determining connections of FPLD interconnect resources necessary to implement the circuit design logic, providing performance information and generating a set of commands for automatic configuration of FPLDs using a device programmer. A circuit design may be first converted into a computer readable form using a hardware description language, or using a schematic capture program. Typical software design tools then perform a "logic optimization" process that includes minimizing the number of logic elements necessary to provide the logic functions defined by the circuit design. Next, typical software design tools perform "technology mapping" in which logic of the circuit design is divided into component logic functions. These component logic functions are then compared to and matched with logic functions implemented by a target FPLD. Because the different FPLDs can implement different logic functions, technology mapping of a circuit design must be performed for each target FPLD. After technology mapping is complete, placement and routing are performed and a bit stream is typically generated which represents the programmed states of all of the programmable components of the target FPLD.

Accordingly, a desirable alternative to conventional field programmable devices programmed through somewhat complex and time consuming software processes would be the ability to externally customize a packaged integrated circuit device by directly changing certain physical characteristics of the device, such as, for example, the dielectric constant of an insulating layer(s) therein.

SUMMARY OF INVENTION

The foregoing discussed drawbacks and deficiencies of the prior art are overcome or alleviated by a method for selectively altering dielectric properties of a semiconductor device. In an exemplary embodiment, the method includes applying energy to a local region of interest, the local region of interest including a thermally alterable dielectric such that said heating caused by the applied energy causes a dielectric constant of the thermally alterable dielectric to change.

In another embodiment, a method for selectively altering the dielectric constant of dielectric material within a semiconductor device includes selecting the dielectric material to be a thermally alterable dielectric material within a local region of interest, and forming an interconnect structure around the local region of interest. The interconnect structure is further configured to provide external input/output access with respect to the semiconductor device. Energy is applied to the interconnect structure such that the heating caused by the applied energy causes the dielectric constant of the thermally alterable dielectric to change.

In still another embodiment, an apparatus for selectively altering the dielectric constant of dielectric material within a semiconductor device includes an interconnect structure formed around a local region of interest, the interconnect structure further configured to provide external input/output access with respect to the semiconductor device. The dielectric material within a local region of interest is selected to be a thermally alterable dielectric material, wherein the interconnect structure is further configured such that the application of energy thereto causes the dielectric constant of the thermally alterable dielectric to change.

BRIEF DESCRIPTION OF DRAWINGS

Referring to the exemplary drawings wherein like elements are numbered alike in the several Figures.

DETAILED DESCRIPTION

Disclosed herein is a method and apparatus for selectively controlling/altering the dielectric properties (i.e., dielectric constant values) of an integrated circuit chip at a localized region within the semiconductor device. Briefly stated, the method provides for localized heating of a dielectric that has a thermally alterable dielectric constant. This may be implemented, in one embodiment, by applying energy (e.g., electric current) to an interconnect structure formed around the localized dielectric region during the semiconductor chip build process. In turn, the application of energy to the interconnect structure causes localized heating of dielectric material that will (depending on the type of dielectric used) increase or decrease the dielectric constant of the material. The localized heating may also be carried out by other means such as, for example, application of infrared (IR) energy, laser, RF or other optical beams directed to the interconnect structure so as to heat or attenuate the surrounded dielectric. The ability to selectively alter dielectric properties after the completion of the wafer or chip build, thus allows for a user to customize the design for specific applications.

Figure 1:
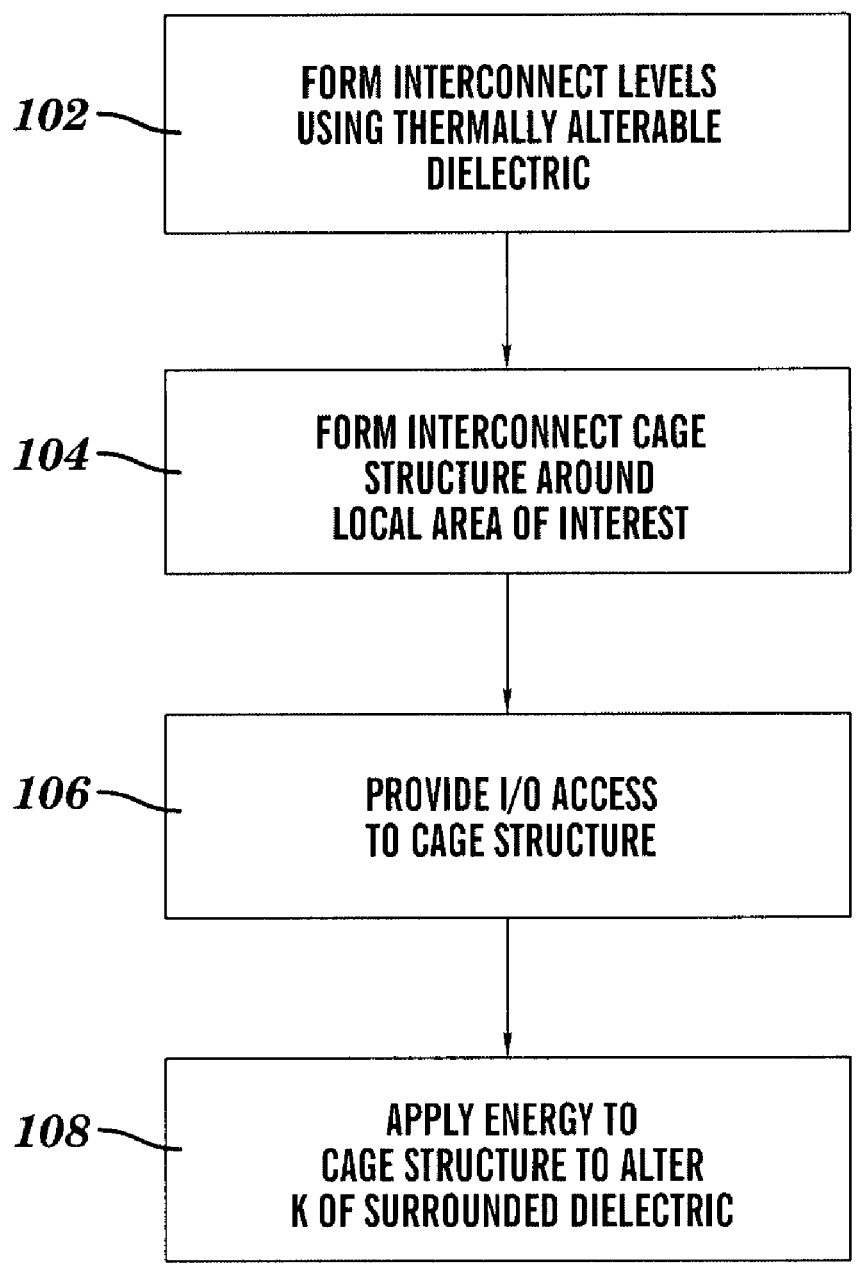
FIG. 1 is a flow diagram illustrating a method for selectively altering the dielectric properties of a localized region(s) within an integrated circuit device, in accordance with an embodiment of the invention.

Referring initially to FIG. 1, there is shown a flow diagram 100 illustrating a method for selectively altering the dielectric properties of a localized region(s) within an integrated circuit device, in accordance with an embodiment of the invention. In block 102, the dielectric levels associated with a semiconductor device (e.g., interlevel dielectrics) are formed with a dielectric material having thermally alterable dielectric constant. For example, a porogen dielectric is a polymeric material that is capable of generating nanoscopic air bubbles (pores), having a dielectric constant of 1.0, within a matrix material (e.g., organosilicates) when heated so as to produce both porous inorganic and organic materials. This sacrificial porogen approach enables the production of thin-film nanoporous dielectric materials.

As shown in block 104, the method further includes the formation of a metallic interconnect structure that surrounds certain localized areas of the porogen dielectric that may be selectively altered with respect to the dielectric constant thereof. In this regard, the interconnect structure (described in further detail hereinafter) may be patterned and formed concurrently with the other interconnect wiring associated with the integrated circuit device. It will be noted that during the final back end of line (BEOL) manufacturing steps, the metal patterning is created such that the interconnect structure will have external I/O access thereto, as would other interconnect features of the device. This is reflected in block 106 of FIG. 1. Finally, as shown in block 108, energy is applied to the interconnect structure of the completed device so as to locally heat the portion of the thermally alterable dielectric surrounded by the interconnect structure.

As discussed above, the applied energy could be in the form of electric current passed through the interconnect structure via external I/O terminals. Additionally, the IC packaging may be made with materials transparent to optical radiation such that an applied laser, IR or UV beam, for example, acts to locally heat the dielectric. Moreover, the applied energy could also be in the form of radio frequency (RF) or other more global energy modes. In each example, however, the dielectric is changed by application of the energy so as to alter (either lower or increase) its dielectric constant.

It will be appreciated that for certain applications, lowering the dielectric constant (K) value would be beneficial by gaining interconnect performance with regard to chip speed, for example. In other applications, such as metal-insulator-metal (MIM) and other devices, increases in K value would allow for specific device operations. Regardless of the desired end user application, the IC device is first constructed using a suitable dielectric that either decreases or increases the K value upon the heating thereof. Again, one example of selectively decreasing the K value would be embodied by the use of multi-component materials wherein a porogen is activated by the applied energy thus forming small air gaps having a K value of 1.0 to lower the overall K value.

Figure 2:
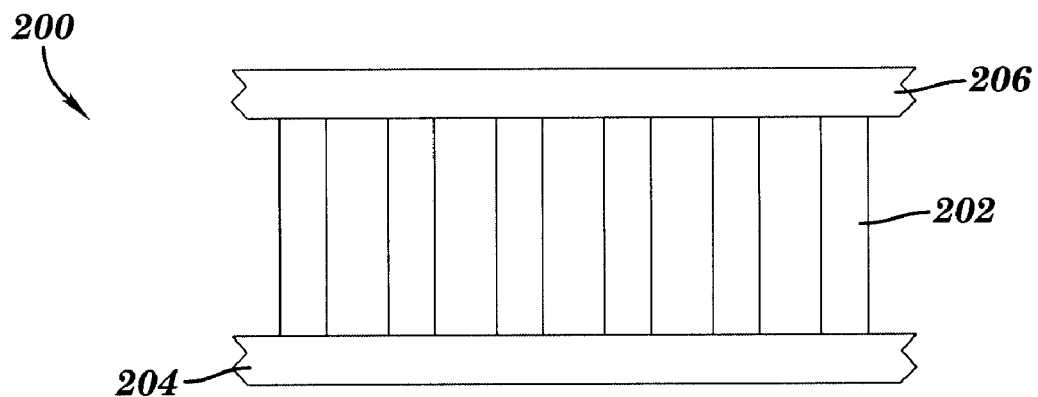
FIG. 2 is cross sectional view of a cage-shaped interconnect structure suitable for use in accordance with an embodiment of the invention.

Referring now to FIG. 2, there is shown a cross sectional view of one possible implementation of a surrounding interconnect structure 200, suitable for use in accordance with a further embodiment of the invention. The exemplary interconnection structure 200 is formed in a cage-like configuration, in which a plurality of metallically filled vias define a series of bars 202 that are disposed between a lower bus bar 204 and an upper bus bar 206. The specific location and positioning of the bus bars 204, 206 and bars 202 will depend upon the configuration and location of the circuit of interest that has the thermally alterable dielectric material associated therewith.

In order to provide adequate thermal energy for dielectric constant alteration, the bars 202 may be formed by filling the vias with a metal such a tantalum (Ta) or tungsten (W) such that when electric current is passed therethrough, the bars act as filaments that will also heat the neighboring dielectric material. On the other hand, the bus bars 204, 206 may be made from a low resistance material, such as copper, for current carrying capability. Although the use of dissimilar materials (with respect to the bus bars 204, 206 and via filled bars 202) in the formation of the cage-like interconnect structure 200 might require additional masking layers, this could be prevented by using small features that (during a Ta—Cu liner/seed process) fill only with Ta, and then are so small that they do not full with adequate seed and thus become tantalum filaments.

Figure 3:
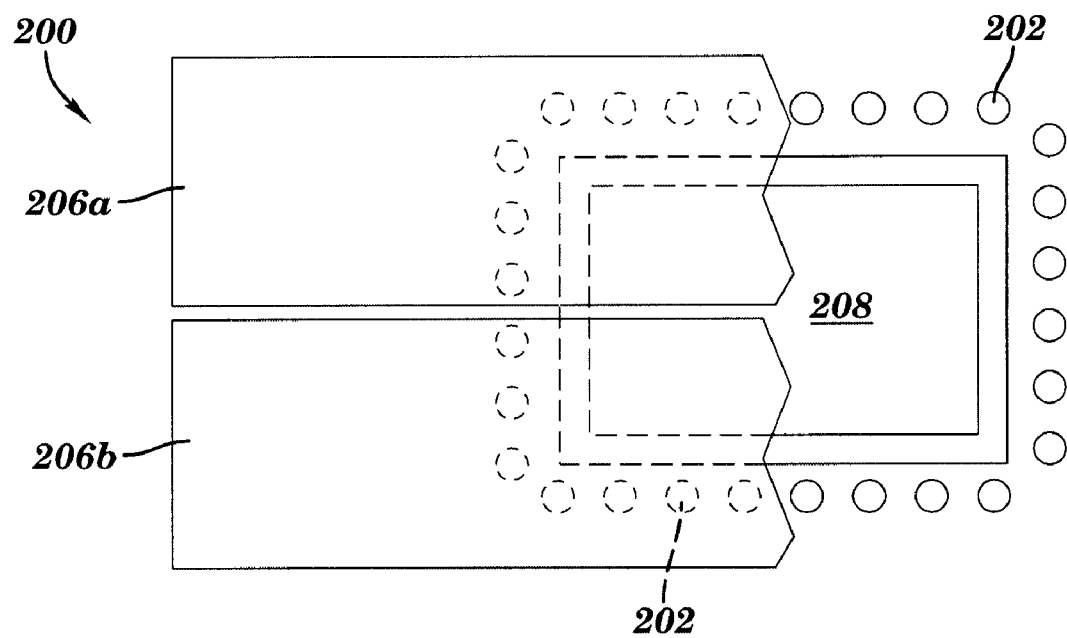
FIG. 3 is a top view of the cage-shaped interconnect structure shown in FIG. 2.

FIG. 3 is a top view of the cage-like interconnect structure 200 of FIG. 2. As is particularly shown, the bars 202 are configured to surround a circuit of interest, denoted generally at 208, that is surrounded with the thermally alterable dielectric material. It will also be noted that the upper and lower bus bars may be formed from a unitary conductor or a series of parallel conductors, such as illustrated by upper bus bars 206a, 206b.

Figure 4:
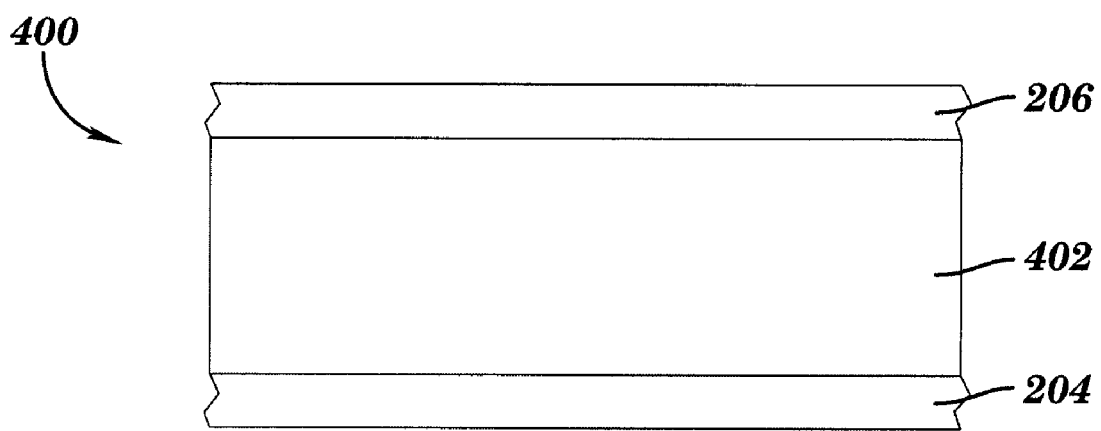
FIG. 4 is an alternative embodiment of the interconnect structure of FIGS. 2 and 3.

It should be appreciated that the cage-like structure 200 represents just one possible embodiment for a surrounding interconnect structure, and that other configurations are also contemplated. For example, the interconnect structure could also be configured into a solid surrounding structure 400 having walls 402 (as shown in FIG. 4), so long as the structure is capable of delivering heating energy to the surrounded dielectric material. Depending upon the particular configuration of the interconnect structure and the type of thermally alterable dielectric material used, it may be desirable to implement a robust semiconductor package design. Because the use of a porogen dielectric material involves the release of certain gaseous byproducts (e.g., CO, $CO_2$, etc.), the interconnect structure will preferably allow for passage of such gas so that the pressures created by the dielectric heating do not cause damage to the circuit interconnects or other chip area.

Thus, any problem of gas evolution from porogens may be addressed by the configuration of the surrounding interconnect structure itself. For example, the structure may be formed either with dedicated openings to allow the gas to relieve itself outward, such as through pipes to the outer surface of the device. Alternatively, the structure may be built to contain the pressure (and possibly even effectively become a near 100% air gap like structure, given sufficient dielectric degradation). The remaining dielectric material could then form a spider-like web of material that holds the interconnects in place, but maintains sufficient separation for operation and attains increased performance.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for selectively altering dielectric properties of a semiconductor device, the method comprising:
    applying energy to an interconnect structure surrounding a local region of interest, said local region of interest including a thermally alterable dielectric such that said heating caused by said applied energy is transferred to said thermally alterable dielectric and causes a dielectric constant of said thermally alterable dielectric to change.

2. The method of claim 1, wherein said thermally alterable dielectric further comprises a porogen material.

3. The method of claim 2, wherein said dielectric constant is decreased when said porogen material is heated by said applied energy.

4. The method of claim 3, wherein said applied energy comprises at least one of: electric current and an optical beam.

5. The method of claim 1, wherein the semiconductor device is provided with packaging material transparent to optical radiation and said applied energy comprises an optical beam applied directly to said thermally alterable dielectric in said local region of interest.

6. A method for selectively altering the dielectric constant of dielectric material within a semiconductor device, the method comprising:
    selecting the dielectric material to be a thermally alterable dielectric material within a local region of interest;
    forming an interconnect structure around said local region of interest, said interconnect structure further configured to provide external input/output access with respect to semiconductor device; and
    applying energy to said interconnect structure such that said heating caused by said applied energy causes the dielectric constant of said thermally alterable dielectric to change.

7. The method of claim 6, wherein said thermally alterable dielectric further comprises a porogen material.

8. The method of claim 7, wherein said dielectric constant is decreased when said porogen material is heated by said applied energy.

9. The method of claim 8, wherein said applied energy comprises at least one of: electric current and an optical beam.

10. The method of claim 6, wherein said interconnect structure further comprises a cage-like structure having lower and upper bus bars and a plurality of metallically filled vias connected between said upper and lower bus bars.

11. The method of claim 10, wherein said lower and upper bus bars comprise copper and said plurality of metallically filled vias further comprise at least one of tantalum and tungsten.

12. The method of claim 6, wherein said interconnect structure further comprises a solid surrounding structure having lower and upper bus bars and a plurality of metallic walls connected between said upper and lower bus bars.

13. An apparatus for selectively altering the dielectric constant of dielectric material within a semiconductor device, the method comprising:
    an interconnect structure formed around a local region of interest, said interconnect structure further configured to provide external input/output access with respect to the semiconductor device; and
    the dielectric material within a local region of interest selected to be a thermally alterable dielectric material;
    wherein said interconnect structure is further configured such that the application of energy thereto causes the dielectric constant of said thermally alterable dielectric to change.

14. The apparatus of claim 13, wherein said thermally alterable dielectric further comprises a porogen material.

15. The apparatus of claim 14, wherein said dielectric constant is decreased when said porogen material is heated by said applied energy.

16. The apparatus of claim 15, wherein said applied energy comprises at least one of: electric current and an optical beam.

17. The apparatus of claim 13, wherein said interconnect structure further comprises a cage-like structure having lower and upper bus bars and a plurality of metallically filled vias connected between said upper and lower bus bars.

18. The apparatus of claim 17, wherein said lower and upper bus bars comprise copper and said plurality of metallically filled vias further comprise at least one of tantalum and tungsten.

19. The apparatus of claim 13, wherein said interconnect structure further comprises a solid surrounding structure having lower and upper bus bars and a plurality of metallic walls connected between said upper and lower bus bars.

* * * * *